US010276767B2

(12) United States Patent
Ide (10) Patent No.: US 10,276,767 B2
(45) Date of Patent: Apr. 30, 2019

(54) LIGHT EMITTING DEVICE

(71) Applicant: NICHIA CORPORATION, Anan-shi, Tokushima (JP)

(72) Inventor: Yoshiyuki Ide, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 79 days.

(21) Appl. No.: 15/608,006

(22) Filed: May 30, 2017

(65) Prior Publication Data
US 2017/0345985 A1    Nov. 30, 2017

(30) Foreign Application Priority Data

May 31, 2016  (JP) ................................ 2016-108125

(51) Int. Cl.
| H01L 33/62 | (2010.01) |
| H01L 25/075 | (2006.01) |
| H01L 33/48 | (2010.01) |
| H01L 33/50 | (2010.01) |
| H01L 33/60 | (2010.01) |
| H01L 33/56 | (2010.01) |

(52) U.S. Cl.
CPC ............ *H01L 33/62* (2013.01); *H01L 25/075* (2013.01); *H01L 33/483* (2013.01); *H01L 33/50* (2013.01); *H01L 33/60* (2013.01); *H01L 25/0753* (2013.01); *H01L 33/56* (2013.01)

(58) Field of Classification Search
CPC ..... H01L 33/54; H01L 23/544; H01L 23/528; H01L 23/5286; G03F 9/00
See application file for complete search history.

(56) References Cited

U.S. PATENT DOCUMENTS 4,423,127 A  * 12/1983  Fujimura ............... G03F 9/7084
                                                                257/E21.211
6,525,406 B1 *  2/2003  Chung ................ H01L 21/4842
                                                                257/666
(Continued)

FOREIGN PATENT DOCUMENTS

| JP | 2012-099544 A | 5/2012 |
| JP | 2012-099545 A | 5/2012 |

(Continued)

*Primary Examiner* — Victoria K. Hall
(74) *Attorney, Agent, or Firm* — Global IP Counselors, LLP (57) ABSTRACT

A light emitting device includes an element mounting board including a base, a set of conductive patterns, one or more light emitting elements, and a cover member. The set of conductive patterns includes one or more first conductive layers and one or more second conductive layers made of a different material. The second conductive layers partially cover the first conductive layers. The set of conductive patterns defines one or more element mounting areas each including a part of the first conductive layers not covered by the second conductive layers, and external connectors each including one or more outer edge exposed parts where a part of an outer edge of a corresponding one of the first conductive layers is exposed from the second conductive layers. The cover member covers the light emitting elements and the element mounting areas. The cover member is spaced apart from the outer edge exposed parts.

13 Claims, 9 Drawing Sheets

(56) References Cited

U.S. PATENT DOCUMENTS

| | | | | |
|---|---|---|---|---|
| 7,768,617 B2* | 8/2010 | Yamazaki | ............ | H01L 21/288 349/143 |
| 8,319,115 B2* | 11/2012 | Ohsumi | ............ | H01L 23/49811 174/260 |
| 9,887,333 B2* | 2/2018 | Ide | ............ | H01L 33/486 |
| 2002/0024981 A1* | 2/2002 | Tojo | ............ | H01S 5/028 372/45.01 |
| 2002/0067751 A1* | 6/2002 | Ohbuchi | ............ | H01S 5/0425 372/45.01 |
| 2008/0006837 A1* | 1/2008 | Park | ............ | H01L 33/486 257/98 |
| 2010/0181365 A1* | 7/2010 | Deley | ............ | B23K 20/004 228/102 |
| 2012/0104452 A1 | 5/2012 | Miyoshi et al. | | |
| 2013/0015561 A1* | 1/2013 | Chen | ............ | H01L 23/544 257/618 |
| 2013/0037968 A1* | 2/2013 | Ishida | ............ | H01L 23/544 257/797 |
| 2014/0239320 A1 | 8/2014 | Miyoshi et al. | | |
| 2015/0263247 A1 | 9/2015 | Wada et al. | | |
| 2015/0270456 A1 | 9/2015 | Miyoshi et al. | | |
| 2016/0133800 A1 | 5/2016 | Miyoshi et al. | | |

FOREIGN PATENT DOCUMENTS

| | | |
|---|---|---|
| JP | 2012-174808 A | 9/2012 |
| JP | 2013-026416 A | 2/2013 |
| JP | 2015-092622 A | 5/2015 |
| JP | 2015-177120 A | 9/2015 |

* cited by examiner

LIGHT EMITTING DEVICE

CROSS-REFERENCE TO RELATED APPLICATIONS

This application claims priority to Japanese Patent Application No. 2016-108125 filed on May 31, 2016. The entire disclosure of Japanese Patent Application No. 2016-108125 is hereby incorporated herein by reference.

BACKGROUND

The present disclosure relates to a light emitting device.

Semiconductor light emitting elements have been used in recent years not only as light sources for lighting applications to replace fluorescent lamps, but also as light sources having high luminance and good directionality, such as automotive headlights and other such light projectors, floodlight, and so forth.

One of the light emitting devices used in these applications has been proposed in Japanese Unexamined Patent Application 2015-177120, for example.

In this light emitting device, a plurality of light emitting elements are arranged on a mounting board equipped with conductive patterns. The conductive patterns connected to the light emitting elements extend to the outside of a scaling member, and are used as external electrodes for connecting to an external power supply.

SUMMARY

With the conductive patterns used as external electrodes, depending on the combination of shapes and/or materials, or other conditions of the conductive patterns and the wire or other such power feed member connected to the conductive patterns, there is the risk that the long-term application of high levels of electrical power may result in poor connection.

A light emitting device according to one embodiment includes an element mounting board, a set of conductive patterns, one or more light emitting elements, and a cover member. The element mounting board includes a base. The set of conductive patterns is disposed on a main surface of the base, and includes one or more first conductive layers and one or more second conductive layers made of a different material from that of the one or more first conductive layers. The one or more second conductive layers partially cover the one or more first conductive layers. The set of conductive patterns defines one or more element mounting areas each including a part of the one or more first conductive layers that is not covered by the one or more second conductive layers, and external connectors each including one or more outer edge exposed parts where a part of an outer edge of a corresponding one of the one or more first conductive layers is exposed from the one or more second conductive layers. The one or more light emitting elements are respectively mounted on the one or more element mounting areas. The cover member covers the one or more light emitting elements and the one or more element mounting areas. The cover member is spaced apart from the one or more outer edge exposed parts.

The light emitting device disclosed herein affords good reliability over the long term in the connection between the light emitting device and an external power feed member.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings.

DESCRIPTION

Embodiments of the present disclosure will now be described through reference to the drawings. However, the light emitting device and so forth described below are intended to be specific examples of the technological concept of the present disclosure, and unless otherwise specified, the present disclosure is not limited to or by what follows. Also, what is described in one embodiment or working example is applicable to another embodiment or working example.

The size, positional relations, and so forth of the members shown in the drawings may be exaggerated to make the description more clear.

Embodiment 1

Light Emitting Device

As shown in FIGS. 1 to 5, the light emitting device 100 according to an embodiment of the present disclosure includes an element mounting board 10 consisting of a base 11 and a set of conductive patterns 12 having one or more element mounting areas 12a and an external connector 12b disposed on a main surface of the base 11; one or more light emitting elements 20 that are mounted on the one or more element mounting areas 12a; and a cover member 40 that covers the one or more light emitting elements 20 and the element mounting area 12a. A set of the conductive patterns 12 include one or more first conductive layers 121 and second conductive layers 122 made of a different material from that of the first conductive layers 121, in this order from the base 11 side. The element mounting areas 12a have the first conductive layers 121 that are not covered by the second conductive layers 122, and the external connectors 12b each have outer edge exposed parts 12e where at least a part of the outer edges of the first conductive layers 121 is exposed from each of the second conductive layers 122, and said outer edge exposed parts 12e are separated from the cover member 40.

Element Mounting Board

Figure 3:
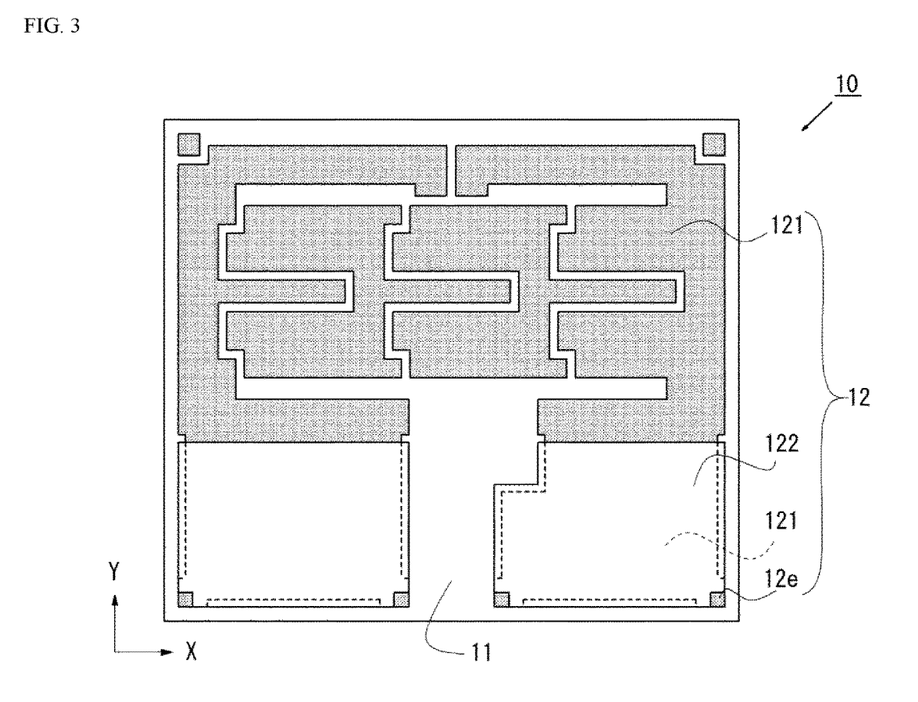
FIG. 3 is a schematic plan view of the first conductive layers and second conductive layers on an element mounting board in FIG. 2.
Figure 4:
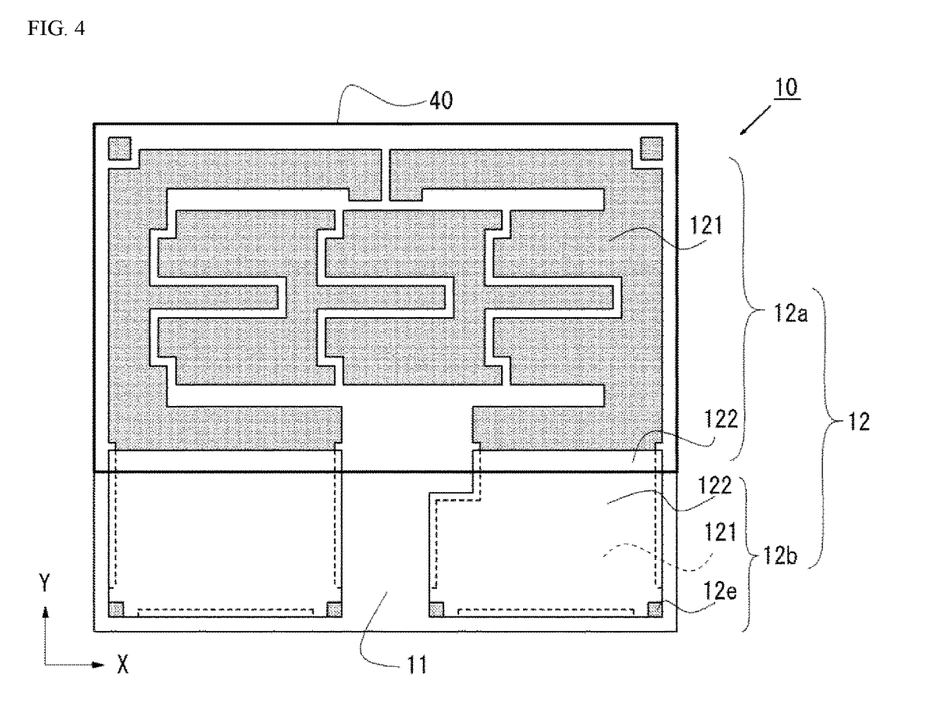
FIG. 4 is a schematic plan view showing the relation between the cover member and the conductive patterns in FIG. 2.

As shown in FIGS. 3 and 4, the element mounting board 10 in this embodiment includes the base 11 and the set of conductive patterns 12 that are disposed on a main surface of the base 11. The set of conductive patterns 12 each includes the element mounting area 12a and the external connector 12b. The conductive patterns 12 each includes the first conductive layer 121 and the second conductive layer 122, which is made from a different material from that of the first conductive layer, in this order from the base 11 side. The element mounting areas 12a include the first conductive layers 121 that is not covered by the second conductive layers 122.

That is, in plan view, the conductive patterns 12 include the element mounting areas 12a, which is the area in which the one or more light emitting elements are mounted, and the external connectors 12b, which are the areas in which power is supplied from the outside. Furthermore, the conductive patterns 12 include at least two conductive layers, namely, the first conductive layer 121 and the second conductive layer 122, and at least part of the second conductive layer 122 is stacked on the first conductive layer.

The one or more light emitting elements 20 (discussed below) are placed on the first conductive layers 121 located on the element mounting area 12a. The external connector 12b includes the first conductive layers 121 and the second conductive layers 122, and the second conductive layers 122 located on the external connector 12b is used as an external electrode of the light emitting device 100 to supply power from the outside.

With this configuration, conductive layers made of different materials can be disposed on the set of conductive patterns 12, with the first conductive layers 121 on the outermost surface of the element mounting areas, and the second conductive layers 122 on the outermost surface of the external power feed area. Thus, conductive layers that are respectively suited for the element joining material and for the external power feed member can be disposed on the outermost surfaces of the element mounting areas 12a and the external connectors 12b. Consequently, the light emitting elements can be joined more securely to the element mounting board, as can the external power feed member to the element mounting board.

Base

The base 11 can be a mounting board that is normally used for mounting the light emitting elements 20, etc. Examples include mounting boards formed from glass, glass epoxy, thermoplastic resin, thermosetting resin, or another such resin, ceramic, paper phenol, paper epoxy, glass composite, low-temperature co-fired ceramic (LTCC), metal members in which the above materials are formed as insulating members, and so forth. Of these, ceramics that have good thermal resistance and environmental resistance can be used to advantage. Examples of ceramic materials include alumina, aluminum nitride, and these ceramic materials may be combined with mullite, and a BT resin, glass epoxy, an epoxy resin, or another such insulating material.

The shape and size of the base 11 can be suitably determined according to the design of the light emitting device. For instance, the base 11 may have a plate-like shape, and one that is flat on the front and back sides is preferable. The planar shape may be quadrangular, circular, elliptical, polyhedral, or the like, but a substantially rectangular shape is preferable from the standpoint of ease of processing.

Conductive Pattern

The element mounting board 10 in this embodiment includes at least a set of conductive patterns 12 on a main surface of the base 11. The one or more light emitting elements 20 are connected above the conductive patterns 12. The planar shape of the conductive patterns 12 on a main surface of the base 11 can be suitably set according to the design of the light emitting device.

As discussed above, the set of conductive patterns 12 each include the one or more element mounting areas 12a and the external connectors 12b. The element mounting areas 12a refers to an area in which the one or more light emitting elements 20 discussed below are mounted, and which are connected to the electrodes of the light emitting elements 20. However, the element mounting areas 12a includes not only the area in which the light emitting elements 20 are mounted, but also the area around it. The external connectors 12b refer to an area that extends from the element mounting areas 12a and that ensure electrical connection with the outside. The element mounting areas 12a and the external connectors 12b refer to mutually different areas in order for the above-mentioned functions to be realized, but the boundary between them in the element mounting board 10 need not be distinct.

The element mounting areas 12a may each include a surface shape that differs from that of the set of conductive patterns so as to correspond to the electrode shape, layout, and so forth of the light emitting elements 20. Also, the external connectors 12b may each include mutually different shapes to make it easy to identify positive and negative. Thus, the planar shapes of the element mounting areas 12a and the external connectors 12b may be the same shapes for the set of patterns, but the different shapes for the set of patterns is preferable.

The external connectors 12b are preferably disposed near the edge of the base 11 (i.e., near the outer edge of the main surface on which the conductive patterns 12 are disposed). For example, the external connectors may be disposed on a base that is substantially rectangular in plan view, (i) extending from the element mounting areas to near the edge of the base in a x direction, (ii) extending from the element mounting areas to near the edge of the base in the x direction, bending, and then extending along the edge of the base to the other edge of the base, (iii) extending from the element mounting areas to near the edge of the base in a different direction from the x direction, such as a y direction that is perpendicular to the x direction, or (iv) extending from the element mounting areas in the y direction to near the edge of the base, bending, and then extending along the edge of the base to another edge of the base.

Thus disposing the external connectors near the edge of the base allows the power feed member, such as a wire, used for feeding power to the external connectors to have a shorter connection length, and allows power to be fed easily and surely. It is especially preferable for the positive and negative external connectors on a base with a substantially rectangular plan view shape each to have a shape that extends toward the same side of this rectangle. This allows external power feed members to be connected with about the same length and from the same direction on both positive and negative external connectors.

The phrase "near the edge" here means that the distance from the outer edge of the base main surface where the conductive patterns are disposed to the conductive patterns is in a range of 0.01 mm to 0.5 mm.

The conductive patterns 12 are such that the one or more first conductive layers 121 and the second conductive layers 122, which are made of a different material from that of the first conductive layers 121, are stacked in this order from the base 11 side. The "different material" here, in the case of a single-layer structure, includes a material in which some of the elements are the same but the rest of the elements are different, and in the case of a layered structure, encompasses a material in which some of the layers are the same but the rest of the layers are different, and a situation in which the stacking orders are different, etc.

The element mounting areas 12a include the first conductive layers 121 that is not covered by the second conductive layers 122. In other words, the element mounting areas 12a are such that the first conductive layers 121 that are each exposed from the second conductive layers 122 are disposed on all or part of the element mounting areas 12a. The light emitting elements 20 are mounted on the first conductive layers 121 at the element mounting areas 12a.

The external connectors 12b include the first conductive layers 121 and the second conductive layers 122, in this order from the base 11 side. The external connectors 12b further include outer edge exposed parts 12e, in which part of the outer edge of the first conductive layers 121 are each exposed from the second conductive layers 122. At the external connectors 12b, the second conductive layers 122 can be used for connecting an external power feed member in the secondary mounting of the light emitting device 100. Also, the outer edge exposed parts 12e can be used for identifying the position of the light emitting face of the light emitting device 100 in the secondary mounting of the light emitting device 100. Since the light emitting elements 20 are mounted on the first conductive layers 121, using the first conductive layers 121 to identify the position of the light emitting face (i.e., the position of the light emitting elements 20) allows the position of the light emitting face to be identified more accurately. In the case that the second conductive layers 122 are used to identify the position of the light emitting face during secondary mounting, position identification accuracy may suffer as a result of dimensional tolerance, etc., in the formation of the second conductive layers 122 on the first conductive layers 121. However, with the light emitting device 100 according to this embodiment, part of the outer edge of the first conductive layers 121 on which the light emitting elements 20 are mounted can be used for position identification during secondary mounting, therefore, the position of the light emitting face can be identified more accurately.

At the external connectors 12b, the first conductive layers 121 (except for the outer edge exposed parts 12e) are preferably covered by the second conductive layers 122. Accordingly, the surface area of the second conductive layers 122 connected to an external power feed member can be increased in the external connectors 12b.

At the outer edge exposed parts 12e, part of the outer edge of the first conductive layers 121 is used to identify position information about the light emitting elements 20 mounted on the first conductive layers 121. Therefore, the outer edge exposed parts 12e preferably include a characteristic point, such as the corners or sides constituting the outer edge of the first conductive layers 121, in order to accurately identify the position of the outer edge exposed parts 12e in the light emitting device 100. More specifically, the outer edge exposed parts 12e preferably include at least part of the sides constituting the outer edge of the first conductive layers 121. It is even more preferable to include two adjacent sides, among the sides constituting the outer edge of the first conductive layers 121. In other words, it is more preferable to include the corners of the outer edge of the first conductive layers 121. If the outer edge exposed parts 12e include the corners of the first conductive layers, it is possible to identify position information in at least two directions with a single outer edge exposed part, and the position of the light emitting face can be identified more accurately.

Further, as shown in FIG. 4, the outer edge exposed parts 12e more preferably are located at the corners of the outer edge of the external connectors 12b. Providing the outer edge exposed parts 12e at the corners of the external connectors 12b makes it easier to identify the position of the outer edge exposed parts 12e in the external connectors 12b, and is also preferable because it is possible to provide a larger area of the second conductive layers used for connecting to an external power feed member.

The surface area of the outer edge exposed parts 12e in plan view (i.e., the surface area of the first conductive layers exposed from the second conductive layers in the external connectors 12b) can be suitably set according to the size of the light emitting device. For instance, it can be about $1/1000$ to $1/10$ the surface areas of the external connectors. More specifically, an example is about 20 μm to 200 μm. In the case that the light emitting device 100 includes a plurality of outer edge exposed parts 12e, the shapes of the outer edge exposed parts in plan view may be the same, or the shapes may be mutually different.

The first conductive layers 121 and the second conductive layers 122 can be formed, for example, as a stacked structure or a single layer of aluminum, gold, platinum, titanium, copper, palladium, rhodium, nickel, tungsten, molybdenum, chromium, silver, or other metal, or an alloy of these. Also, ITO or other conductive material other than a metal may be used.

The element mounting areas 12a include the first conductive layers 121 that are not covered by the second conductive layers 122, and the light emitting elements 20 are mounted on the first conductive layers 121. The outermost surfaces of the first conductive layers 121 preferably contain gold. Since the electrodes of the light emitting elements 20 usually employ gold, in the case that the outermost surfaces of the first conductive layers 121 are layers that contain gold, connection with the light emitting elements 20 is more reliable. A gold-gold connection realizes good reliability, so the connection portion is less likely to degrade even under the high voltage application condition, and a highly reliable connection can be maintained over an extended period. More specifically, the first conductive layers 121 can be formed by a single-layer film of gold or a layered film in which AlSiCu/Ti/Pt/Au, Ti/Rh/Au, W/Pt/Au, Rh/Pt/Au, Ni/Pt/Au, Ti/Rh/Au, or the like are stacked from the base side. When separation of the first conductive layers due to impact during element mounting is taken into account, the total thickness of the first conductive layer 121 is preferably 1.0 μm or more, and more preferably 3.0 μm or more. In particular, when the outermost surface is gold, the thickness of the gold is preferably at least 1.0 μm. The total thickness of the first conductive layer 121 is preferably about 10.0 μm or less. Such thickness allows the desired layer to be formed in a suitable amount of time, and increases in film formation time and material cost is likely to be suppressed.

The external connectors 12b include the first conductive layers 121 and the second conductive layers 122, in this order from the base 11 side, and include the outer edge exposed parts 12e where part of the outer edge of the first conductive layers 121 is exposed from the second conductive layer 122. An external power feed member is connected to the second conductive layers of the external connectors. For example, the outermost surface of the second conductive layers 122 are preferably layers that contain copper or aluminum, and are more preferably layers that contain aluminum. In the case that the outermost surfaces of the second conductive layers are layers that contain aluminum or the like, wires or other members made of aluminum or other material can be used for the power feed members carrying electricity to the external connectors 12b. Aluminum is less expensive than gold, and is preferable as a power feed material because it can be easily joined with ultrasonic waves alone, without having to use heat treatment.

From the standpoint of connection reliability, the power feed member connected to the external connectors 12b are preferably made of the same metal material as the outermost surfaces of the external connectors 12b. When a connection is made between different metal materials, the different metals diffuse into each other to form an alloy layer, but depending on the combination of metal materials, the alloy layer will become brittle as diffusion progresses, and this may lead to poor connection. However, in the case that the same metal material is used for the power feed member and the outermost surface of the second conductive layers 122, alloying and degradation of the metal at the connection portion, which is particularly attributable to the heat generated by the light emitting elements, can be avoided, thereby ensuring more reliable connection over an extended period. More specifically, this can be formed by a single-layer film of aluminum or copper, or a layered film in which Ti/Al, Ti/Cu, Ni/Al, Ni/Cu, or the like are stacked from the first conductive layer side. The total thickness of the second conductive layer 122 is preferably 1.0 µm or more, and more preferably 3.0 µm or more. In particular, when an aluminum layer is used for the outermost surface, since aluminum is a soft metal, the thickness of the aluminum layer is preferably 2.0 µm or more, to take into account of peeling occurred by impact in joining of the power feed member. Also, the total thickness of the second conductive layer is preferably about 10.0 µm or less, taking into account a suitable film formation time, material costs, and so forth.

In addition to the above-mentioned set of conductive patterns 12, the element mounting board 10 may also include conductive patterns for making electrical connection with the light emitting elements 20, according to the number of light emitting elements 20 to be mounted. For example, one or more relay-use conductive patterns corresponding to the element mounting areas 12a of the set of conductive patterns 12 may be arranged between the element mounting areas 12a of the set of conductive patterns 12. As to the shape and layout of the conductive patterns disposed between the set of conductive patterns 12, the power supply control thereof, and so forth, a plurality of light emitting elements may be disposed so as to be driven independently, depending on the shape of the set of conductive patterns 12. Otherwise, the conductive patterns may be disposed so as to be driven in series, in parallel, or in a combination of these.

The conductive patterns 12 need only be disposed at least on the front side of the base, but may also be disposed on the back side of the base along the lateral faces of the base or via through-holes in the base, etc.

Method for Forming Conductive Patterns

The conductive patterns can be formed by methods known in the art. For instance, one of the following methods (i) to (iii) can be used, or a method that combines parts of these can be used.

(i) A first conductive film constituting a first conductive layer is formed on a main surface of a base, and the first conductive film is formed into a specific shape by etching with a first conductive layer mask to form a first conductive layer. Subsequently, a second conductive film constituting a second conductive layer is formed over the base on which the first conductive layer has been formed, and the second conductive film is formed into a specific shape by etching with a second conductive layer mask to form a second conductive layer.

(ii) The first conductive layer and the second conductive layer are formed in this order on a main surface of the base, and the first conductive layer mask and the second conductive layer mask are used to etch the second conductive layer and the first conductive layer in this order in to a specific shape.

(iii) The first conductive film is formed on a main surface of a base using a first conductive layer mask that is open in the shape of the first conductive layer, and the first conductive film on the first conductive layer mask is removed by lift-off to form the first conductive layer with a specific shape. Subsequently, the second conductive layer mask that is open in the shape of the second conductive layer is formed on the base on which the first conductive layer was formed, the second conductive film is formed on this, and the second conductive film on the second conductive layer mask is removed by lift-off to form the second conductive layer with a specific shape.

The first conductive film and the second conductive film can be formed by a known method, such as vapor deposition, sputtering, CVD, or ALD. A mask can be formed by photolithography, printing, or the like.

Light Emitting Elements

For the light emitting elements 20, light emitting diodes are usually employed.

The composition, emission color and wavelength, size, number, and so forth of the light emitting elements 20 can be suitably selected to match the application. For example, a nitride semiconductor ($In_XAl_YGa_{1-X-Y}N$; $0 \leq X$, $0 \leq Y$, $X+Y \leq L$) can be used as a blue or green light emitting element, and GaAlAs or AlInGaP can be used as a red light emitting element.

The light emitting elements 20 are usually formed by laminating a semiconductor layer on a growth substrate (such as a sapphire substrate). The substrate may have rough surface that is joined to the semiconductor layer. This allows the critical angle when light emitted from the semiconductor layer hits the substrate to be varied intentionally, and allows light to be easily extracted to the outside of the substrate.

The growth substrate may be removed from the light emitting elements 20 after the lamination of the semiconductor layer. This removal can be accomplished, for example, by polishing, LLO (laser lift off), or the like. Also, in the case that the growth substrate is removed, a mounting-use support substrate may be provided to the semiconductor layer.

The light emitting elements 20 preferably include a set of positive and negative electrodes on the same surface. This allows the light emitting elements to be flip-chip mounted on the mounting board. In this case, the surface that is opposite the surface where the set of electrodes is formed serves as the main light extraction face. In flip-chip mounting, an electroconductive paste-like joining member such as solder, a thin-film joining member, or a bump-like joining member is used to electrically connect the light emitting elements to the conductive patterns on the base.

Alternatively, in the case that face-up mounting is used, the surface on which the set of electrodes is formed may serve as the main light extraction face.

The light emitting elements 20 may employ one that a positive electrode is disposed on a surface on which a negative electrode is disposed. In the case that the light emitting elements have an opposing electrode structure in which the set of positive and negative electrodes are provided on opposite surfaces, the lower surface electrode is fixed to a conductive pattern on the base with a conductive member, and the upper surface electrode is connected to the base with a conductive wire or the like. In either case, the surface on the opposite side from the surface that is opposite the element mounting board of the light emitting elements 20 can be the upper surface, and the upper surface can be the main light extraction face.

The outermost surfaces of the set of positive and negative electrodes of the light emitting elements 20 are preferably made of gold. Gold is chemically stable, ensuring reliable electrical connection over an extended period. Also, as discussed above, in the case that the outermost surfaces of the first conductive layer is a layer that contains gold, the material can be the same as that of the first conductive layer, and in particular a gold-gold connection can be made, which affords connection with better reliability.

A single light emitting device may include just one light emitting element 20, or may include two or more. In the case that a single light emitting device includes a plurality of light emitting elements, the light emitting elements are preferably arranged in order. The light emitting elements may, for example, be disposed in a single row, or may be disposed in a matrix. The number and planar shape of the light emitting elements can be suitably set according to the characteristics, size, and so forth of the light emitting device to be obtained.

The arranged light emitting elements are preferably close to one another. In the case of an automotive application, taking into account the luminance distribution on the light emitting face of the light emitting device, the distance between light emitting elements is preferably shorter than the size of the light emitting elements on, for example, length along one side of one of the light emitting elements. For instance, about 30% or less of the size of the light emitting elements themselves is preferable, and even more preferably 20% or less. Thus disposing the light emitting elements close together can realize a light emitting device that is a surface light source with little emission unevenness.

The mounting of the light emitting elements 20 on the element mounting board 10 is usually performed with a joining member 60 in between. Examples of the joining member here include solder based on tin-bismuth, tin-copper, tin-silver, gold-tin, or the like, alloys whose main components are gold and tin, alloys whose main components are gold and silicon, alloys whose main components are gold and germanium, and other such eutectic alloys, silver, gold, palladium, and other such conductive pastes, bumps, ACP, ACF, or other such anisotropic conductive materials, low-melting point braze materials, and conductive adhesive materials and/or conductive composite adhesive materials that are a combination of these.

It is especially preferable for the light emitting elements 20 to be mounted on the conductive patterns with a joining member 60 that contains gold, and even more preferable for each electrode of the one or more light emitting elements to be joined to the set of conductive patterns with a joining member that contains gold. In the case that the outermost surface of the first conductive layer is a layer that contains gold, using a joining member that contains gold will more reliably ensure a stable connection over an extended period of time.

Cover Member

Figure 1:
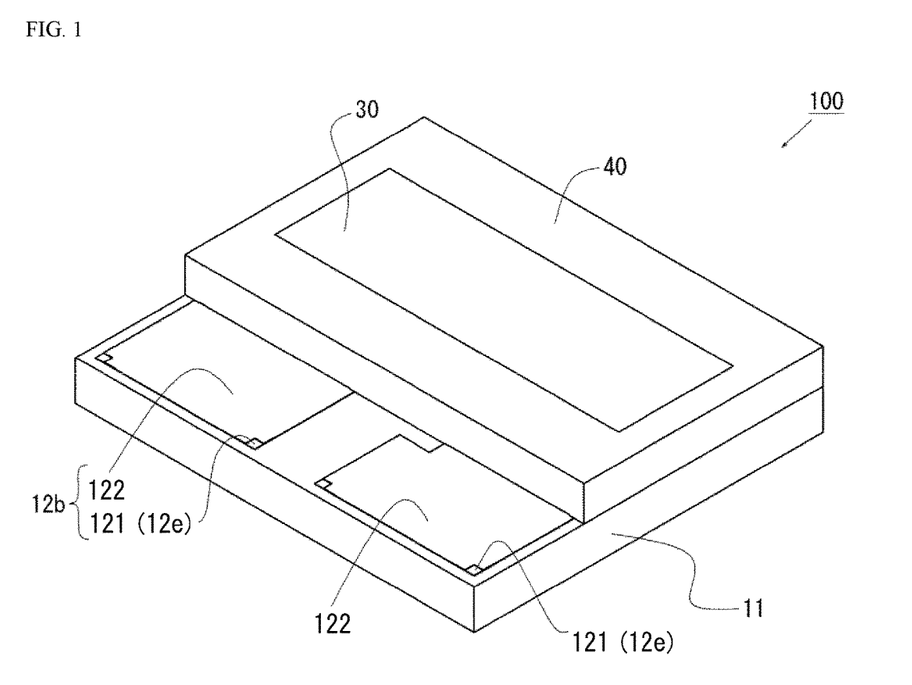
FIG. 1 is a schematic perspective view of an embodiment of the light emitting device disclosed herein.
Figure 2:
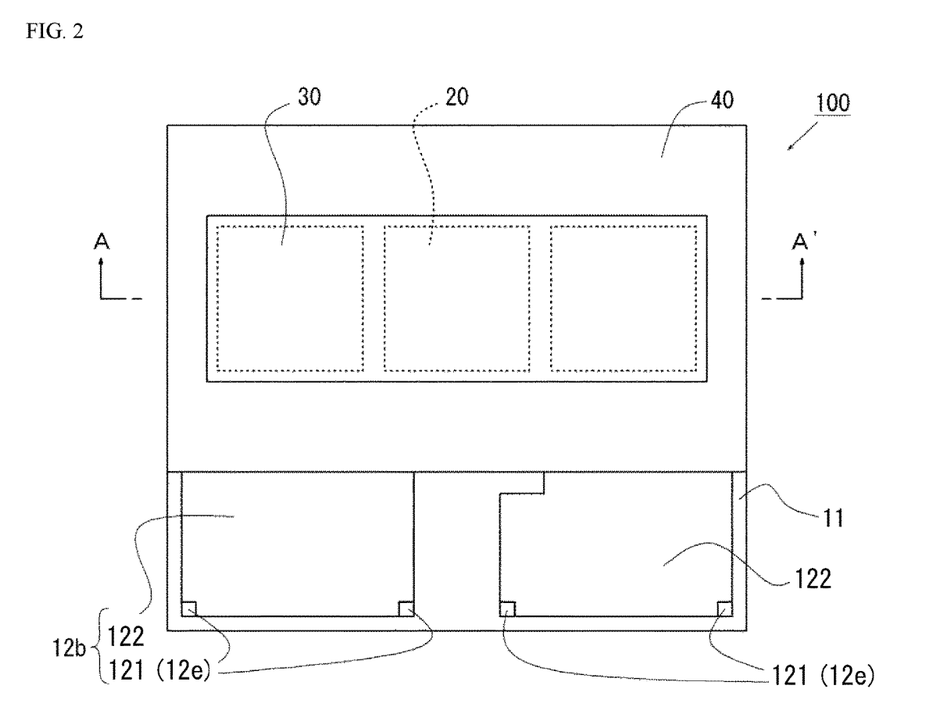
FIG. 2 is a schematic plan view of an embodiment of the light emitting device disclosed herein.
Figure 5:
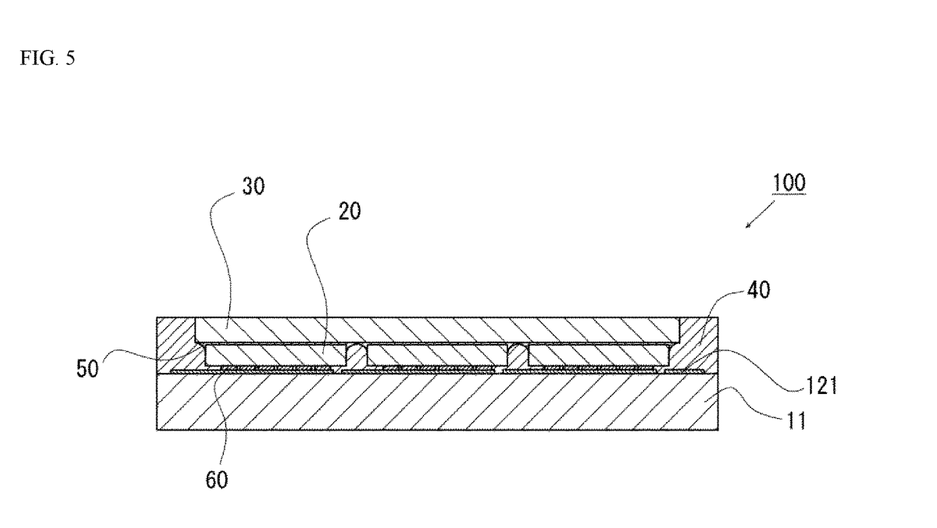
FIG. 5 is a cross sectional view along the A-A' line in FIG. 2.

As shown in FIGS. 1, 2, and 5, the cover member 40 reflects the light traveling toward some directions other than a direction to the upper surface of a light transmissive member 30 in the light emitting device 100 so that the light will be emitted from the upper surface of the light transmissive member 30, and also covers the lateral surfaces of the light emitting elements 20 and the light transmissive member 30 and thereby protects the light emitting elements 20 from external force, dust, gas, and so forth. The cover member 40 is provided such that the upper surface of the light transmissive member 30 is exposed as the emission face of the light emitting device 100, and so as to cover part of the upper surface of the element mounting board 10 as well as the light transmissive member 30 and the light emitting elements 20. The meaning of "covering" here includes that one or more other layers interposes between the cover member 40 and the light transmissive member 30, the cover member 40 and the light emitting elements 20, and the cover member 40 and the element mounting board 10. Examples of such other layers include an adhesive material 50 discussed below and an underfill or other embedded member.

The adhesive material 50 is used when the upper surfaces of the light emitting elements are provided with a light transmissive member 30 that covers these light emitting element upper surfaces. When the adhesive material 50 is interposed between the light emitting elements 20 and the cover member 40, the adhesive material 50 is preferably disposed so as not to bulge out from the area directly below the light transmissive member 30.

Also, when an embedded member is interposed between the cover member 40 and the light transmissive member 30, the light emitting elements 20, and the element mounting board 10, this embedded member is preferably a substance with good light reflectivity. In the case that the embedded member has high optical reflectivity, its interposed thickness can be set as desired.

In the case that the upper surfaces of the light emitting elements 20 serve as the light extraction face of the light emitting device 100, the cover member 40 disposed between the light emitting elements is preferably substantially flush with the upper surfaces of the light emitting elements. In this Specification, the term "substantially flush" means that a height difference of about ±10%, and preferably about ±5%, of the thickness of the cover member is allowable.

Alternatively, in the case that the upper surface of the light transmissive member 30 serves as the light extraction face of the light emitting device 100, then the upper surface of the cover member is preferably substantially flush with the upper surface of the light transmissive member.

Also, in the case that a plurality of light transmissive members 30 are respectively disposed on the upper surfaces of a plurality of light emitting elements 20, the cover member disposed between the light transmissive members is preferably substantially flush with the upper surfaces of the light transmissive members.

The shape of the cover member 40 can be suitably set according to the number of light emitting elements, the layout of the light emitting elements, and so forth. It is especially preferable for the planar shape to be rectangular or a shape that is similar to that. In plan view, part of the outer edge of the cover member 40 preferably coincides with the outer edge of the above-mentioned element mounting board 10. The outer edge of the cover member 40 on the external connector side of the conductive patterns 12 on the element mounting board 10 is preferably parallel or substantially parallel to the outer edge of the element mounting board and the outer edge of the external connectors, such as the outer edge of the end extending in the x direction or the y direction. The term "substantially parallel" as used here means that tolerance of about ±10°, and preferably about ±5, from parallel is allowable.

In the light emitting device 100 of this embodiment, the boundary between the element mounting areas 12a and the external connectors 12b can be demarcated by the cover member 40 discussed below. In other words, the outer edge of the cover member 40 can be demarcated by the boundary between the element mounting areas 12a and the external connectors 12b. That is, the element mounting areas 12a are each disposed on the upper surface of the light emitting device 100 and are integrally covered by the cover member 40 along with the lateral surfaces of the light emitting elements 20 and the light transmissive member 30, while the external connectors 12b are not covered by the cover member 40.

In the light emitting device 100 of this embodiment, the surface of the first conduction layer 121 preferably has the wettability higher than that of the surface of the second conduction layer 122.

Consequently, for example, when the cover member 40 is formed of a resin material or is bonded with a resin material, the resin component bleeding out from the resin material is less likely to wet and spread out over the external connectors 12b.

As discussed above, the outermost surface of the first conduction layer 121 is preferably a layer that contains gold. The surface of the first conductive layer in which gold is used for the outermost surface has good wettability with solder or the like, and has good connection reliability with the joining member 60. Adversely, due to the good wettability, the resin composition bleeding out from the resin material tends to wet on and spread out over the surface. In the light emitting device 100 according to this embodiment, however, since the outer edge exposed parts 12e of the first conduction layer 121 in the external connectors 12b are separated from the cover member 40, the resin in the cover member formation process is less likely to wet and spread out over the external connectors 12b by running through the first conduction layer 121.

At the external connectors 12b, the first conduction layer 121 is preferably covered by the second conduction layer 122 except for the outer edge exposed parts 12e. That is, the outermost surface of the conductive patterns 12 touching the outer edge of the cover member 40 is preferably the second conduction layer 122. In this case, the outermost surface of the second conduction layer 122 is preferably a metal layer other than gold. In the case of metals other than gold, oxidation films tend to be formed on the surfaces of the metals in the air, and thus such metals on which oxidation films are formed tends to have poor wettability. Therefore, the resin composition is less likely to spread by disposing the second conductive layers at a position in contact with the outer edge of the cover member 40.

That is, the resin composition is less likely to spread to the external connectors 12b by disposing the first conduction layer 121, which has higher wettability than the surface of the second conduction layer 122, away from the outer edge of the cover member 40. As a result, the poor join and so forth is less likely to occur between the external connectors and the power feed member caused by wetting and spreading of the resin composition during formation of the cover member.

The cover member 40 can be formed of a material that is able to reflect the light emitted from the light emitting elements 20. Consequently, the light emitted from the light emitting elements is reflected within the light emitting elements at the boundary between the light emitting elements 20 and the cover member 40. As a result, the light propagates within the light emitting elements, and is emitted from the upper surfaces of the light emitting elements to the upper surface of the light transmissive member, and ultimately extracted to the outside.

The cover member 40 can be formed using at least one light reflecting substance and a resin such as a silicone resin, a modified silicone resin, an epoxy resin, a modified epoxy resin, and an acrylic resin, or a hybrid resin containing one or more of these. Examples of light reflecting substances include titanium oxide, silicon oxide, zirconium oxide, potassium titanate, alumina, aluminum nitride, boron nitride, and mullite. Depending on the amount of the light reflecting substance contained in the cover member 40, the amount of light reflected and transmitted by the cover member 40, etc. can be varied, so it can be suitably adjusted according to the characteristics of the light emitting device to be obtained and other such considerations. For example, the content of the light reflecting substance is preferably 30 wt % or more.

The cover member may be made of a material that dissipates heat in addition to reflecting light.

The cover member preferably has the thermal conductivity of 0.2 W/m·K or more, and more preferably at least 1 W/m~K. Heat dissipation can be improved by setting the thermal conductivity high. Examples of such materials include boron nitride and aluminum nitride, which have high thermal conductivity.

For example, as will be discussed below, in the case that the light transmissive member contains at least one phosphor, the phosphor may generate heat by Stokes loss, and this heat can lower light conversion efficiency. In contrast, when the cover member has high thermal conductivity, it will be able to efficiently dissipate the heat of the phosphor in the light transmissive member.

The cover member can be formed, for example, by injection molding, potting, printing, transfer molding, compression molding, etc.

Light Transmissive Member

The light transmissive member 30 is disposed on the upper surface side of the light emitting elements 20. The light transmissive member 30 is joined to the upper surfaces of the light emitting elements. The light transmissive member 30 includes an upper surface and a lower surface, having a function that the light emitted from the light emitting elements is incident on the lower surface, and the upper surface serves as the light extraction face, and the light is emitted from the upper surface to the outside. The light transmissive member preferably transmits 60% or more of the light emitted from the light emitting elements, for example.

The light transmissive member 30 preferably covers the entire upper surfaces of the light emitting elements 20 in order for the light emitted from the light emitting elements 20 to be extracted efficiently. That is, as seen from the upper surface side of the light transmissive member 30, the light emitting elements 20 are preferably covered such that they are enveloped by the light transmissive member 30.

The light transmissive member 30 may cover the plurality of light emitting elements individually, or may cover the light emitting elements integrally.

The outer peripheral surface of the light transmissive member 30 is preferably covered by the cover member 40.

The light transmissive member 30 can have a thickness about 50 μm to 300 μm.

In the case that a single light emitting device includes a plurality of light transmissive members, the upper surfaces of the light transmissive members are preferably flush or substantially flush with one another. This more effectively discourages interference between the light rays emitted from the lateral surfaces of the light transmissive members. Meanwhile, regardless of the number thereof, the light transmissive member(s) may have upper surfaces in any of a variety of shapes, such as a projections-depressions shape, a curved surface, or a lens shape. The lower surface(s) of the light transmissive member is/are preferably parallel to the light extraction face(s) of the light emitting element(s).

The light transmissive member 30 can contain a light scattering material, or a phosphor capable of converting the wavelength of at least part of the light incident from the light emitting elements 20. Examples of a light transmissive member 30 containing a phosphor include a sintered phosphor, and a phosphor powder that is added to a resin, glass, or another inorganic substance. The sintered phosphor may be the product of sintering a phosphor alone, or may be formed by sintering a mixture of a phosphor and a sintering auxiliary. When a mixture of a phosphor and a sintering auxiliary is sintered, the sintering auxiliary preferably employ silicon oxide, aluminum oxide, titanium oxide, or another inorganic material. This helps reduce deformation and discoloration of the sintering auxiliary by light or heat even though the light emitting elements 20 have a high output. The higher the light transmissive member 30 has transmissivity, the more light is reflected at the boundary with the cover member 40, thereby allowing luminance to be increased.

The phosphor contained in the light transmissive member 30 can be one that can be excited by the light emitted by the light emitting elements 20. For example, one of the following specific examples can be used alone, or two or more types may be combined.

Specific examples of phosphors that can be excited by blue light emitting elements or ultraviolet light emitting elements include a cerium-activated yttrium-aluminum-garnet-based phosphor (such as $Y_3(Al,Ga)_5O_{12}$:Ce), a cerium-activated lutetium-aluminum-garnet-based phosphor (such as $Lu_3(Al,Ga)_5O_{12}$:Ce), a nitrogen-containing calcium aluminosilicate-based phosphor activated by europium and/or chromium (such as $CaO-Al_2O_3-SiO_2$:Eu), a europium-activated silicate-based phosphor (such as $(Sr,Ba)_2SiO_4$:Eu), a β SiAlON-based phosphor (such as $Si_{6-z}Al_zO_zN_{8-z}$:Eu (0<Z<4.2)), a CASN-based phosphor (such as $CaAlSiN_3$), an SCASN-based phosphor (such as $(Sr,Ca)AlSiN_3$:Eu), or another such nitrogen-based phosphor, a manganese-activated potassium fluorosilicate-based phosphor (such as $K_2SiF_6$:Mn), a sulfide phosphor, and a quantum dot phosphor. These phosphors can be combined with a blue light emitting element or an ultraviolet light emitting element to manufacture light emitting devices of various colors (such as a white light emitting device). In the case of the light emitting device capable of emitting white light, the type and concentration of the phosphor contained in the light transmissive member are adjusted to obtain white light. In the case that such a phosphor is contained in the light transmissive member 30, the concentration of the phosphor is preferably about 5% to 50%, for example.

The light transmissive member 30 is joined so as to cover the upper surfaces (i.e., the light extraction faces) of the light emitting elements 20. This joining can be accomplished, for example, by compression bonding, sintering, bonding with a known adhesive such as an epoxy or silicone, bonding with an organic adhesive agent with a high reflective index, bonding with a low-melting point glass, or the like.

The light transmissive member is usually disposed on the upper surfaces of the light emitting elements, but depending on its configuration, it may cover part of the external connectors and/or the element mounting areas of the conductive patterns. That is, it may cover part of the first conductive layers and/or part of the second conductive layers.

Other Members

As discussed above, when the light emitting elements are joined on a mounting board, embedded members that reflect light may be disposed between the base and the light emitting elements. This allows the light emitted downward from the light emitting elements to be reflected, thus increasing the luminous flux. Also, stress caused by the difference in the coefficient of thermal expansion between the light emitting elements and the base can be absorbed, or heat dissipation can be enhanced. These embedded members may be disposed integrally directly under the light emitting elements from the lateral surfaces of the light emitting elements, or the members directly under the light emitting elements may be partially separated from the members on the lateral surfaces.

The embedded members disposed directly under the light emitting elements can be formed of a material selected from the material forming the cover member that covers the lateral surfaces of the light emitting elements. The embedded member may be formed of a different material from that of the cover member, but is preferably formed of the same material.

A Zener diode or other such protective element may be mounted in the light emitting device disclosed herein. For instance, by disposing a protective element so as to be embedded in the cover member, this prevents the protective element to absorb or block light from the light emitting elements, thus the light extraction is less likely to be reduced.

Embodiment 2

Figure 6A:
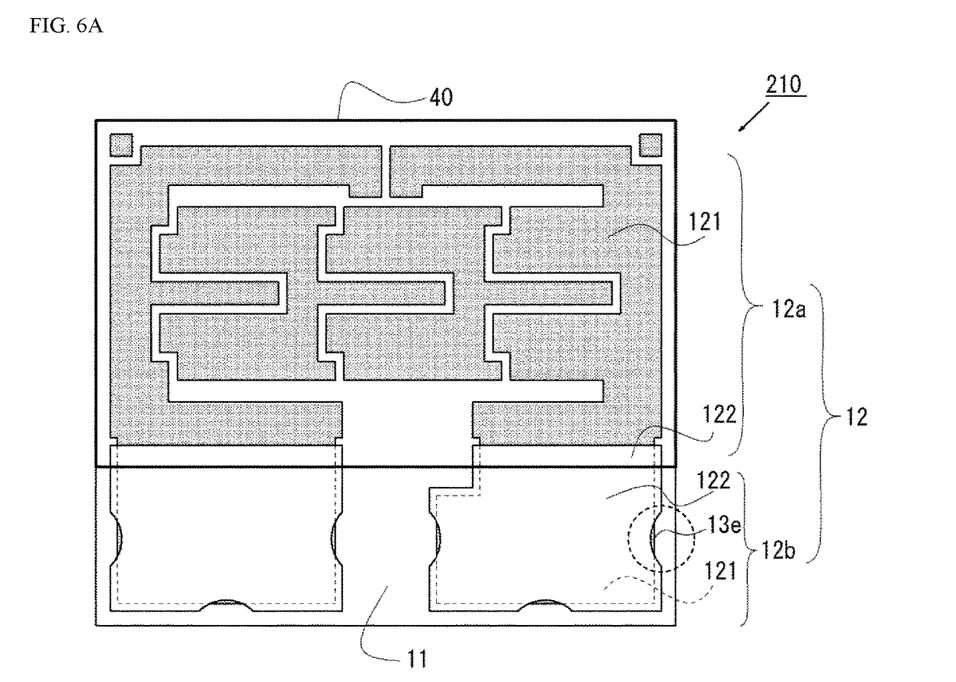
FIG. 6A is a schematic plan view showing the relation between the cover member and the conductive patterns in another embodiment of the light emitting device disclosed herein.

In the following, a description will be given of an element mounting board 210 provided in the light emitting device of Embodiment 2 according to the present disclosure. As shown in FIG. 6A, the element mounting board 210 of Embodiment 2 differs from the element mounting board 10 of Embodiment 1 in the position and shape of outer edge exposed parts 13e of the external connectors 12b.

Figure 6B:
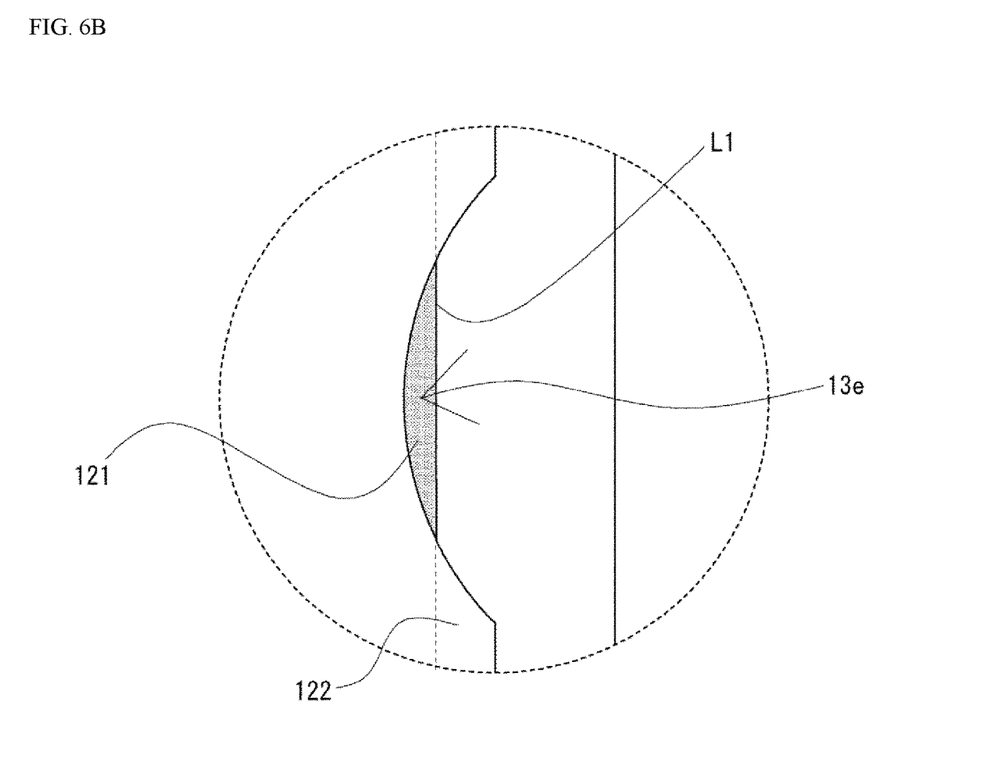
FIG. 6B is a detail view of the portion surrounded by the dotted-line circle in FIG. 6A.

More specifically, as shown in FIG. 6B, the outer edge exposed parts 13e in Embodiment 2 are such that one side L1 among the sides constituting the outer edge of the first conduction layer 121 is exposed from the second conduction layer 122. In Embodiment 2, each of the set of conductive patterns 12 includes three outer edge exposed parts 13c. Because the conductive patterns 12 each include three of the outer edge exposed parts 13e where parts of three of the sides constituting the outer edge of the first conduction layer 121 are exposed, the position can be identified by the three outer edge exposed parts in three directions. That is, in Embodiment 2, the outer edge exposed parts 13e can be used to identify the position of the light emitting face in secondary mounting, thus mounting accuracy can be improved.

In Embodiment 2, as with in Embodiment 1, bonding the light emitting elements to the element mounting board, and connecting the external power feed member to the element mounting board can each be made more rigidly and more reliably, therefore the resin composition is less likely to wet and spread over the external connectors.

Embodiment 3

Figure 7A:
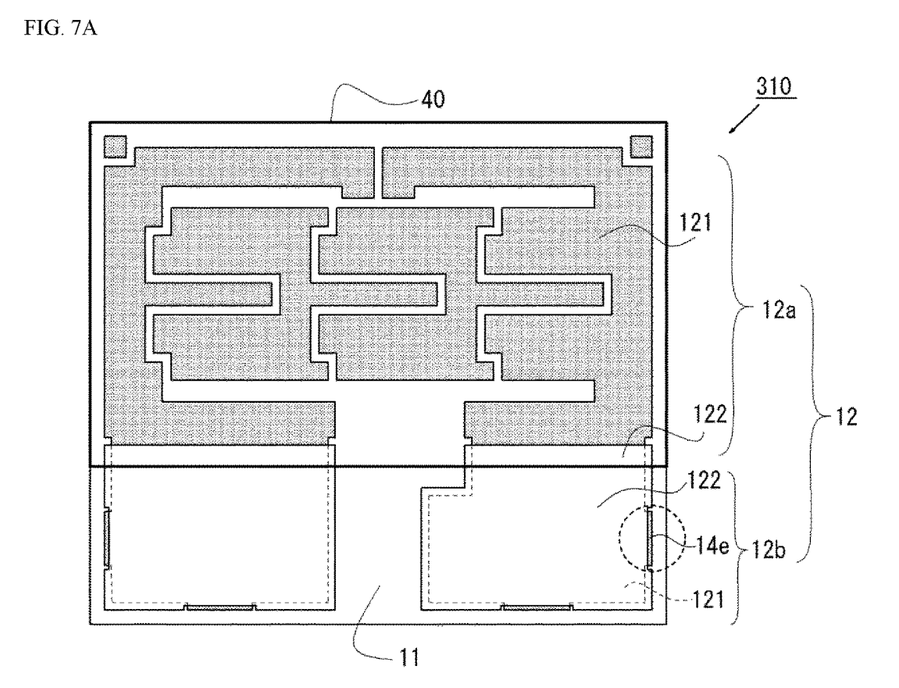
FIG. 7A is a schematic plan view showing the relation between the cover member and the conductive patterns in yet another embodiment of the light emitting device disclosed herein.

In the following, a description will be given of an element mounting board 310 provided to the light emitting device of Embodiment 3 according to the present disclosure. As shown in FIG. 7A, the element mounting board 310 of Embodiment 3 differs from the light emitting device 100 of Embodiment 1 in the position and shape of outer edge exposed parts 14e of the external connectors 12b.

Figure 7B:
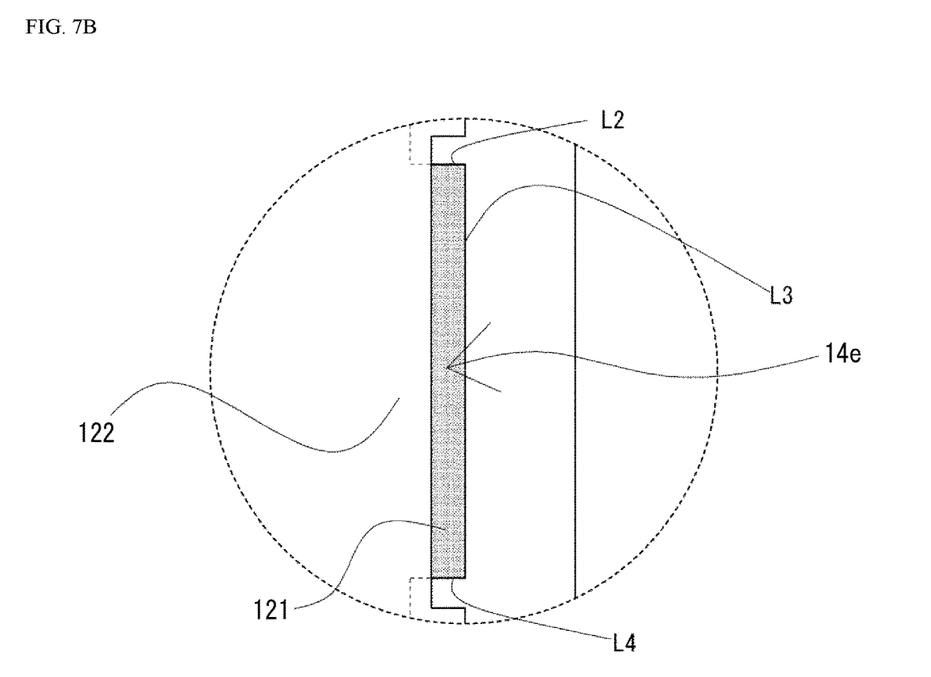
FIG. 7B is a detail view of the portion surrounded by the dotted-line circle in FIG. 7A.

More specifically, as shown in FIG. 7B, the outer edge exposed parts 14e of Embodiment 3 are such that three contiguous sides L2, L3, and L4 among the sides constituting the outer edge of the first conduction layer 121 are exposed from the second conduction layer. In Embodiment 3, each of the set of conductive patterns 12 includes two outer edge exposed parts 14e. Because one of the outer edge exposed parts 14e of the external connector 12b includes the three contiguous sides L2, L3, and L4 among the sides constituting the outer edge of the first conduction layer 121, and corners located in between these sides, the position can be identified by a single outer edge exposed part 14e in three directions. That is, in Embodiment 3, the outer edge exposed parts 14e can be used to identify the position of the light emitting face in secondary mounting, thus mounting accuracy can be improved.

In Embodiment 3, as with in Embodiment 1, bonding the light emitting elements to the element mounting board, and connecting the external power feed member to the element mounting board can each be made more rigidly and more reliably, therefore the resin composition is less likely to wet and spread over the external connectors.

The light emitting device of the present disclosure can be used for a variety of light sources employed in, for example, lighting, various kinds of indicators, interior and exterior lighting for vehicles, display, liquid crystal backlight lights, signaling devices, components installed in vehicles, and signage channel letters.

What is claimed is:

1. A light emitting device comprising:
   an element mounting board including a base;
   a set of conductive patterns disposed on a main surface of the base, and including one or more first conductive layers and one or more second conductive layers made of a different material from that of the one or more first conductive layers with a surface of each of the one or more first conductive layers having wettability higher than that of a surface of each of the one or more second conductive layers, the one or more second conductive layers partially covering the one or more first conductive layers, the set of conductive patterns defining
   one or more element mounting areas each including a part of the one or more first conductive layers that is not covered by the one or more second conductive layers, and
   external connectors each including one or more outer edge exposed parts where a part of an outer edge of a corresponding one of the one or more first conductive layers is exposed from the one or more second conductive layers;
   one or more light emitting elements respectively mounted on the one or more element mounting areas; and
   a cover member covering the one or more light emitting elements and the one or more element mounting areas, the cover member being spaced apart from the one or more outer edge exposed parts.

2. The light emitting device according to claim 1, wherein at least one of the one or more outer edge exposed parts is disposed in at least one corner of a corresponding one of the one or more first conductive layers.

3. The light emitting device according to claim 1, wherein each of the external connectors includes a plurality of the outer edge exposed parts.

4. The light emitting device according to claim 1, wherein each of the one or more first conductive layers includes an outermost layer that contains gold.

5. The light emitting device according to claim 4, wherein the one or more light emitting elements are respectively mounted on the one or more element mounting areas using joining members that contain gold.

6. The light emitting device according to claim 1, wherein each of the one or more second conductive layers includes an outermost layer that contains copper or aluminum.

7. The light emitting device according to claim 1, wherein the base has a substantially rectangular shape in plan view, and
each of the external connectors has a shape that extends toward a same side of the substantially rectangular shape of the base.

8. The light emitting device according to claim 1, wherein the base has a boundary between the one or more element mounting areas and the external connectors, and
the boundary is demarcated by a part of an outer edge of the cover member.

9. The light emitting device according to claim 1, wherein each of the one or more first conductive layers has a thickness in a range of 1.0 μm to 10.0 μm.

10. The light emitting device according to claim 1, wherein
each of the one or more second conductive layers has a thickness in a range of 2.0 μm to 10.0 μm.

11. The light emitting device according to claim 1, wherein
the cover member contains at least one light reflecting substance.

12. The light emitting device according to claim 1, further comprising
at least one light transmissive member disposed on an upper surface of each of the one or more light emitting elements,
wherein the cover member covers at least one lateral surface of the at least one light transmissive member.

13. The light emitting device according to claim 12, wherein the at least one light transmissive member contains at least one phosphor.

\* \* \* \* \*